(12) United States Patent
Badkoubeh

(10) Patent No.: US 11,378,947 B2
(45) Date of Patent: Jul. 5, 2022

(54) SYSTEM AND METHODS OF FAILURE PREDICTION AND PREVENTION FOR ROTATING ELECTRICAL MACHINERY

(71) Applicant: AB Cognitive Systems Inc., Calgary (CA)

(72) Inventor: Amir Badkoubeh, Calgary (CA)

(73) Assignee: AB Cognitive Systems Inc., Calgary (CA)

( * ) Notice: Subject to any disclaimer, the term of this patent is extended or adjusted under 35 U.S.C. 154(b) by 71 days.

(21) Appl. No.: 16/920,169

(22) Filed: Jul. 2, 2020

(65) Prior Publication Data
US 2022/0004179 A1 Jan. 6, 2022

(51) Int. Cl.
G01R 31/34 (2020.01)
G05B 23/02 (2006.01)
G01R 31/28 (2006.01)

(52) U.S. Cl.
CPC ..... G05B 23/0283 (2013.01); G01R 31/2837 (2013.01); G01R 31/343 (2013.01)

(58) Field of Classification Search
CPC ............ G05B 23/0283; G01R 31/2837; G01R 31/343
USPC ............................................. 324/765.01, 166
See application file for complete search history.

(56) References Cited

U.S. PATENT DOCUMENTS

| | | | | |
|---|---|---|---|---|
| 6,035,265 A * | 3/2000 | Dister | ................. | G01R 31/343 324/765.01 |
| 9,050,894 B2 * | 6/2015 | Banerjee | ............... | B60L 3/0061 |
| 10,063,124 B2 * | 8/2018 | Donolo | ................. | H02K 11/35 |
| 2012/0098477 A1* | 4/2012 | Gao | ..................... | G01R 31/343 318/798 |
| 2012/0242348 A1* | 9/2012 | Elze | ..................... | G01R 31/343 324/551 |
| 2015/0331051 A1* | 11/2015 | Maki | ..................... | G01M 13/04 324/765.01 |
| 2017/0268960 A1* | 9/2017 | Jaramillo-Velasques | | ................... G05B 23/024 |

(Continued)

FOREIGN PATENT DOCUMENTS

CN 202218191 U * 5/2012
WO 2019136554 A1 7/2019

OTHER PUBLICATIONS

T.J. Walter, M.M. Marchione, and H. Gordon Shugars, Vibration Monitoring of Vertically Mounted Pumps—Tools for Manufacturers and Users, Proceedings of the Fourth International Pump Symposium, Turbomachinery Laboratory, Department of Mechanical Engineering, Texas A&M University, Houston, Texas, United States, pp. 75-83, May 1987.

(Continued)

Primary Examiner — Tung X Nguyen
Assistant Examiner — Robert P Alejnikov, Jr.
(74) Attorney, Agent, or Firm — Suiter Swantz pc llo

(57) ABSTRACT

A system for monitoring operation of rotating electrical machinery including electrical industrial machinery. The system comprises analog sensors configured to measure electrical signals corresponding to the voltage and the current of the rotating electrical machinery. A remote processor identifies the frequency components of the measured electrical signals. Based on the frequency components, the system is monitored and controlled. This may help allow electrical faults, mechanical faults and process faults to be predicted and/or prevented.

19 Claims, 13 Drawing Sheets

(56) References Cited

U.S. PATENT DOCUMENTS

2019/0113575 A1* 4/2019 Finney .................. G01R 31/34
2019/0195733 A1* 6/2019 Stansloski ........... G01M 13/045

OTHER PUBLICATIONS

R. Pragale, D Shipp, Investigation of premature ESP failure and oil field harmonic analysis, IEEE Transactions on Industry Applications, vol. 53, No. 3, pp. 3175-3181, May 2017.
J. Shadley, B. Wilson, M. Dorney, Unstable Self-Excitation of Torsional Vibration in AV induction motor driven rotational systems, ASM Tran., Journal of Vibration and Acoustics, vol. 114, pp. 226—Apr. 1992.
S. Rabbi, T. Kahnamouei, X. Liang, J. Yang, Shaft Failure Analysis if Soft-Starter Fed Electrical Submersible Pumps Systems, IEEE Open Journal of Industry Applications, pp. 1-10, Dec. 3, 2019.
112-1991—IEEE Standard Test Procedure for Polyphase Induction Motors and Generators, Electric Machines Committee of the IEEE Power Engineering Society, 65 pages, Sep. 19, 1996.

* cited by examiner

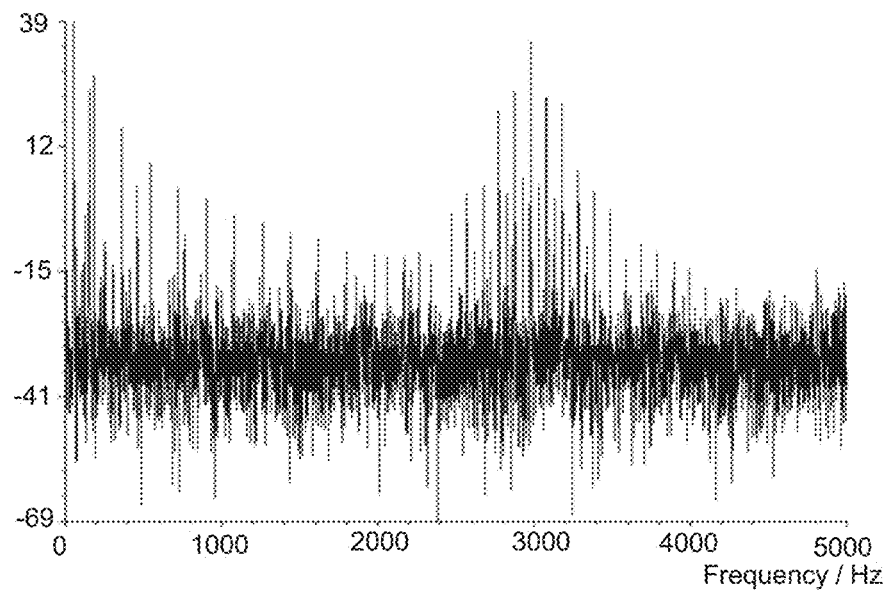
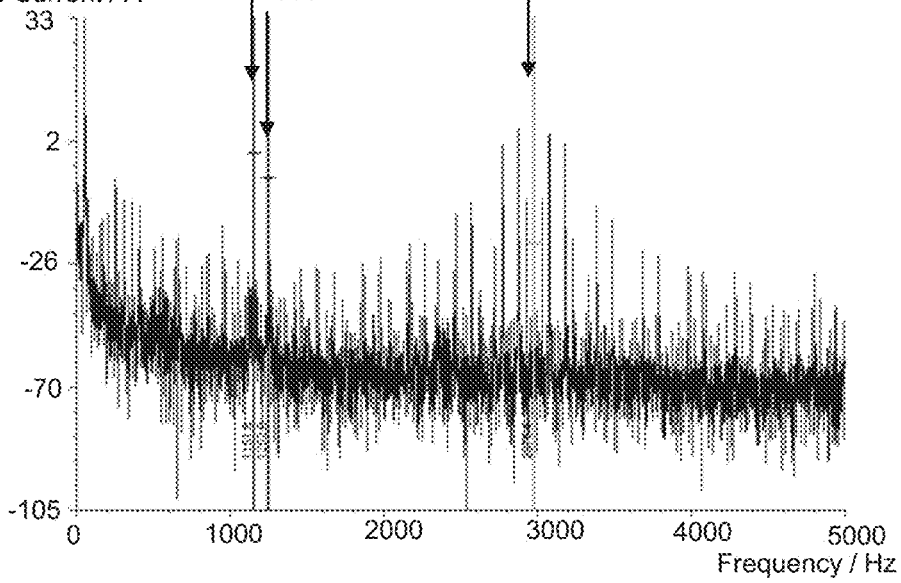

SYSTEM AND METHODS OF FAILURE PREDICTION AND PREVENTION FOR ROTATING ELECTRICAL MACHINERY

FIELD OF THE INVENTION

The invention relates to system and methods for monitoring rotating electrical machinery. Rotating electrical machinery may be configured to convert mechanical energy into electrical energy (a generator), and/or electrical into mechanical (a motor).

BACKGROUND

Electric rotating machinery includes electric motors; electrical generators; motor-generators; and rotary transformers.

An electric motor is an electrical machine that converts electrical energy into mechanical energy. Most electric motors operate through the interaction between the motor's magnetic field and electric current in a wire winding to generate force in the form of torque applied on the motor's shaft. Electric motors can be powered by direct current (DC) sources, such as from batteries, motor vehicles or rectifiers, or by alternating current (AC) sources, such as a power grid, inverters or electrical generators.

Motor-generators may be used for various conversions including:

Alternating current (AC) to direct current (DC)
DC to AC
DC at one voltage to DC at another voltage. (Also called a dynamotor, short for dynamo-motor)
Creating or balancing a three-wire DC system.
AC at one frequency to AC at another harmonically related frequency
AC at a fixed voltage to AC of a variable voltage
AC single-phase to AC three-phase A generator is a device that converts motive power (mechanical energy) into electrical power for use in an external circuit.

SUMMARY

In accordance with the present disclosure, there is provided a system for monitoring operation of rotating electrical machinery, comprising:

analog sensors configured to measure electrical signals corresponding to the voltage and the current of the rotating electrical machinery; and a remote processor configured to receive the measured electrical signals and to identify the frequency components of the measured electrical signals.

The identified frequency components may span the frequency range from 1 Hz to 1 MHz. The identified frequency components may span the frequency range from 1 Hz to 10 kHz.

The electrical signals may be measured by a plurality of sensors, each sensor being sensitive to different frequency ranges.

The remote processor may be connected to the sensor by a wired or a wireless connection.

The analog sensors may comprise: a Hall sensor and/or a Rogowski coil; and a current transformer. A Hall sensor or Rogowski coil may be used for relatively low frequencies. A current transformer may be used for relatively high frequencies.

The system may be configured to receive speed signals corresponding to the set speed and the actual speed of the electrical drive.

The frequency components of the measured electrical signals may be identified by applying a time-frequency transform (e.g. a Fourier Transform). Types of Fourier Transform include Fast Fourier Transform (FFT), Short-Time Fourier Transform (STFT), Discrete Fourier Transform (DFT) and Welch power spectral density. A Short-Time Fourier Transform may be useful if the state of the REM is changing (e.g. the motor is changing speed).

The sensors may be located within a high-voltage panel and the remote processor is located outside the high-voltage panel.

The remote processor may be battery powered.

The processor may be configured to identify harmful or fault frequency components within the current and voltage electrical signals frequency spectra.

The measured electrical signals may be transmitted to the remote processor via one or more of: ethernet and fibre-optic cable.

The system may be configured to continuously monitor the rotating electrical machinery in real time.

The system may be configured to compare the frequency spectra of the current electrical signals to the frequency spectra of the voltage electrical signals.

The system may be configured to monitor the frequency spectra of the electrical signals determine changes in the frequency spectra over time.

The system may be configured to monitor how the frequency spectra of the electrical signals varies with velocity of the rotating electrical machinery.

The system may be configured to measure 3-phase electrical signals.

The rotating electrical machinery may comprise an electrical motor.

The rotating electrical machinery may comprise an electrical generator.

According to a further aspect, there is provided a method for monitoring operation of rotating electrical machinery, comprising:

measuring analog electrical signals corresponding to the voltage and the current of the rotating electrical machinery;

receiving the measured electrical signals at a remote processor; and identifying the frequency components of the measured electrical signals.

According to a further aspect, there is provided a method for monitoring and controlling operation of an electrical drive of a motor in a rotary electric machine comprising:

receiving a current and voltage signals and a speed for the rotary electric machine;

identifying frequency components of the current and voltage signals;

monitoring the system in normal use to determine normal frequency components of the torque signal; and identifying a fault frequency component based on deviations of the identified frequency components of the current and voltage signals from the normal frequency components of the current and voltage signals.

The method may comprise receiving a raw torque signal. The torque signal may be calculated from the current. The method may comprise receiving a reference speed for the motor and a measured speed of a motor.

The method may comprise identifying a fault frequency; and sending a control signal to the electrical drive to impedance match the identified fault frequency. A fault frequency may correspond to an existing fault (e.g. broken gear) and/or be a harmful frequency which may lead to a fault if the machine continues to be operated in the same manner.

The method may comprise one or more of: estimating the time to failure; estimating the cause of failure; and calculating PI controller gains.

The system may be configured to identify a peak and determine faults based on changes in the sidebands around this peak.

The system may be configured to identify how quickly a fault is developing based on identifying how different harmonics of one frequency change as a result of the fault.

The system may be is configured to identify a damaged component by associating an identified fault frequency with a harmonic frequency of the component. An identified fault frequency may be a frequency which does not appear when the system is running normally.

The system may be configured to identify problems based on one or more of:
  determining whether the frequency spectrum has developed repeating peaks or harmonics;
  determining whether the amplitude of existing peaks is changing; and/or
  determining if there are new peaks (e.g. not associated with a harmonic of an existing peak).

The system may be configured to identify problems based on determining whether or not peaks present in the current spectrum are also present in the voltage spectrum. If there are no significant peaks in the current spectrum (i.e. peaks which are new or different in magnitude to normal operation), the system may be configured to determine that the system is operating normally with no damage.

The system may be is configured to identify process related issues by identifying a fault frequency which is not associated with a harmonic frequency of a component of the rotating electrical machinery. Process related issues may include, for example cavitation of a fluid being pumped, flow turbulence or other components relating to materials which are interacting with the rotating electrical machinery. Process related fault frequency may have a low frequency (e.g. between 1-100 Hz).

The system may be is configured to identify power supply issues by identifying a fault frequency in the voltage spectrum. The system may be is configured to identify power supply issues by identifying one or more fault frequencies in the voltage spectrum which are the same as in the current spectrum (e.g. having the same frequency).

The pole pass frequency of a motor may be taken as the slip frequency times the number of poles. The slip frequency is the difference between the actual RPM and the synchronous speed.

All pumps, fans and compressors will normally have a peak in the spectrum at the "blade pass" or "vane pass" frequency. This is the number of blades or vanes multiplied by the shaft speed. The amplitude of the peak can increase if the gap between the blades or vanes and the stationary diffusers is not kept equal.

Rotating equipment may have a peak corresponding to the gear mesh frequency. In addition to their fundamental rotational frequencies, meshing gears produce a vibration which is the product of the number of teeth and their rotational frequency, and is an indication of machine health.

Rotating equipment may have a characteristic frequency corresponding to bearing and/or shaft eccentricity.

The system may be configured to monitor reciprocating components such as a compressor.

One or more electrical, mechanical and/or process related frequency signatures can be extracted from motor current and voltage. This may be considered to be condition monitoring. These features, extracted from the condition of the system, could be used for Failure Prediction.

Process faults may be associated with the material with which the machine is interacting (e.g. a pump inducing cavities in the fluid). Mechanical faults may be associated with physical components of the machine (e.g. worn gears, broken components). Electrical faults may be associated with electrical components of the machine (e.g. windings). Power source faults may be associated with the power provided to the machine (e.g. fluctuations in the mains power itself). The system may be configured to distinguish between one or more of these types of fault.

The controller may comprise a proportional-integral-derivative controller (PID controller or three-term controller). A PID controller is a control loop mechanism employing feedback that is widely used in industrial control systems and a variety of other applications requiring continuously modulated control. A PID controller continuously calculates an error value as the difference between a desired setpoint (SP) and a measured process variable (PV) and applies a correction based on proportional, integral, and derivative terms (denoted P, I, and D respectively).

The controller may comprise a proportional-derivative controller (PD) and/or a proportional-integral controller (PI) controller. It will be appreciated that, in the context of this disclosure, a PID controller is a type of PD controller and is a type of PI controller. The controller may comprise a Fuzzy-PID controller. The controller may comprise a Fuzzy-PD and/or a Fuzzy-PI controller.

In the field of machine learning and specifically the problem of statistical classification, a confusion matrix, also known as an error matrix, is a specific table layout that allows visualization of the performance of an algorithm, typically a supervised learning one. Each row of the matrix represents the instances in a predicted class while each column represents the instances in an actual class (or vice versa). The confusion matrix makes it easy to see if the system is confusing two classes (i.e. commonly mislabeling one as another).

BRIEF DESCRIPTION OF THE DRAWINGS

Various objects, features and advantages will be apparent from the following description of particular embodiments of the present disclosure, as illustrated in the accompanying drawings. The drawings are not necessarily to scale, emphasis instead being placed upon illustrating the principles of various embodiments of the present disclosure. Similar reference numerals indicate similar components.

FIG. 13a is a graph of the VSD voltage Spectrum from 0 to 5000 Hz.

FIG. 13b is a graph of the VSD Current spectrum from 0 to 5000 Hz.

DETAILED DESCRIPTION

Introduction

Figure 1:
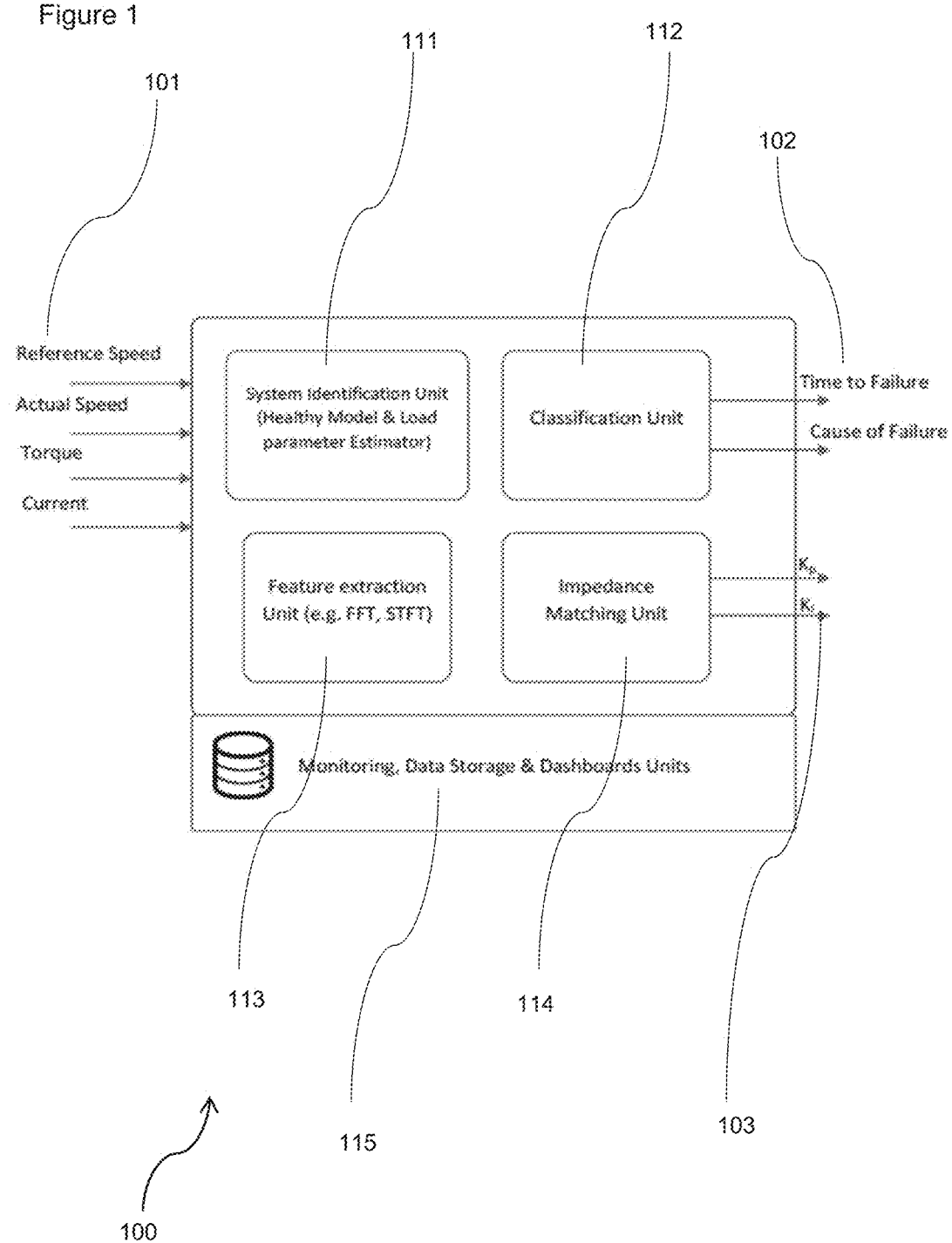
FIG. 1 is a schematic of a failure prediction module.

Motor current signature analysis is a condition monitoring technique used to diagnose problems in induction motors. The main advantage of this technique over other condition monitoring technics is that it does not require direct access to the motor or associated load. As a result, this type of monitoring is especially attractive for applications located in remote and harsh environments such as ESPs, electric pumps, mobile mining equipment, compressors, etc. The underlying concept is to use the sensitivity of the electric motor to small fluctuations on motor load. Any faults and vibrations that increase motor load are independent of the distance from the motor and can be detected on the motor current.

Failure prediction techniques are based on combinations of theoretical modeling from first principles and empirical modeling based on measurement data. The techniques fully derived by first principles are called white box and require a deep expert domain knowledge. The black box techniques, on the opposite side of the spectrum, based solely on measurement data. There are many methods in transitions from white box to black box modelling which are called gray box modeling.

One aspect of the present disclosure relates to a black box technique for failure prediction and prevention of variable speed drive (VSD) rotating a load. The method may be agnostic to the load. Other embodiments may be used to detect process faults, or faults which arise from the interaction of the machine with the load (e.g. of the pump with the fluid pumped, of a drill with the material being drilled).

One of the distinguishing features of the method disclosed herein is to utilize the healthy data of the system unlike other black box techniques which require a history of failure data. The proposed failure prediction technique builds a healthy model of the system a priori. It predicts the time to failure based on the deviation of the frequency contents of the current state from that of a healthy state. The system is configured to build a frequency model of the system either based on the model of the system or based on data measured by the sensors over a period of time (e.g. which is deemed to correspond to normal operation). The system monitors frequencies, amplitude of each frequencies and sidebands. Based on the deviation from this frequency model the system may be configured to identify multiple states such as: Normal operation; Maintenance required; and Urgent stop. It also could calculate the likelihood of the cause of failure based on a fault database.

VSDs are tuned to deliver constant speed regardless of the load dynamics. In other words, the only tuning objective is to minimize the error between the reference and the actual speed. Thus, they sacrifice the maximum power transmission and minimum signal reflection. As such, the drive increases the likelihood of failure by reflecting the harmful frequencies generated in the load and acting as a pure reflector.

Impedance matching is a common technic of adjusting the input impedance of an electric load or the output impedance of its corresponding signal source to maximize the power transfer and minimize signal reflection from the load. This technique is widely used when wave transfers from one medium to another such as power electronics, transmission lines and communication systems. This technique may be considered for electric drives running a load to improve the aforementioned criteria. However, this technique requires a good understanding of the load model and its parameters which is not trivial in many industrial applications.

In some embodiments, the present method addresses an impedance matching method based on online estimation of the load. This method increases the dampening of the drive on a selected harmful frequency and maximize the power transmission to the load. As a result, the method reduces fatigue, wear and power consumption.

Various subsystems of the presented disclosure include:
Condition Monitoring;
Failure Prediction;
Failure Prevention;
Model-based monitoring; and
Data-driven method.

Various applications of the presented disclosure will . . . :
Submersible Pumps (can apply to other artificial lift methods);
Gearbox driven rotating electric machineries (electric trucks and shovels, wind turbines, electric top drives);
reciprocating equipment (compressors); and
Belt drive equipment (conveyors).

One objective of this disclosure is to expand this concept from a troubleshooting tool of electric motors to a continuous monitoring tool for electric machines. To achieve this, not only the 3-phase currents are measured but also the voltages. That is because the change in input voltages will cause change in the currents. Furthermore, various signal processing techniques and domain knowledge are applied to extract and identify the electrical and mechanical problem with the system as well as load/process related issues such as torsional vibrations, cavitation. For embodiments located in a harsh and inaccessible environment this method may be a cost-effective source of monitoring.

Another objective of this disclosure is to tune the variable speed drive (VSD) in an electrical machine system to mitigate the resonance and certain harmful vibrations. The energy saving and performance improvement possible through the use of VSDs are causing them to become an integral part of the systems. However, VSDs exacerbate two issues in the electrical machine operation. First, they may generate significant harmonics. They convert 60 Hz AC to DC and then again to AC at the frequency determined by the motor speed which can result in significant harmonics in the systems. Second, the VSDs are tuned to provide constant speeds. As a result, they act as a pure reflector. In the other words, the electric impedance of the VSD is much higher than, for example, the impedance of a multi-stage ESP with long vertical part. This mismatch impedance causes different response time and consequently sever torsional vibrations on shaft and coupler assembly. This can cause torsional failures.

Various aspects of the present disclosure will now be described with reference to the figures. For the purposes of illustration, components depicted in the figures are not necessarily drawn to scale. Instead, emphasis is placed on highlighting the various contributions of the components to the functionality of various aspects of the present disclosure. A number of possible alternative features are introduced during the course of this description. It is to be understood that, according to the knowledge and judgment of persons skilled in the art, such alternative features may be substituted in various combinations to arrive at different embodiments.

Failure Prediction

As illustrated in FIG. 1, the system 100 consists of a system identification unit 111, a feature extraction unit 113, a classification unit 112 for failure prediction, and an online parameter estimator and an impedance matching unit 114 for failure prevention. A memory, database of failure, monitoring and data analytics dashboard 115 are considered for data storage and user interface. The system reads inputs 101 including motor torque, stator currents, reference speed and actual speed as inputs. The system is configured to calculate one or more of the following: failure outputs 102 including the time to failure and/or the probable cause of failure; and PI-controller gains 103 ($K_p$, $K_I$) to mitigate the effect of harmful dynamics generated in the load. That is, mitigating the harmful dynamics may help prevent failure, rather than simply predict it.

Figure 2:
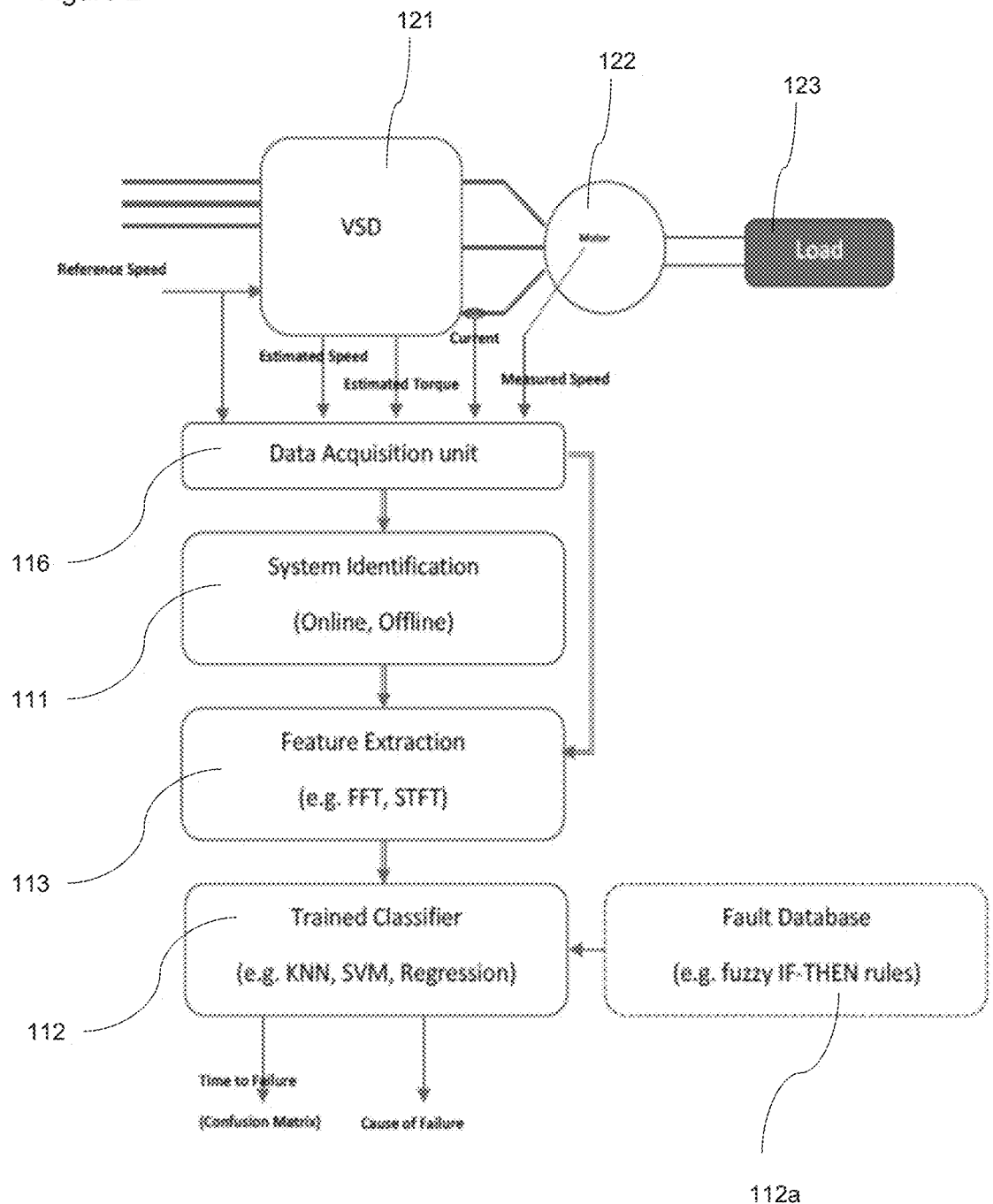
FIG. 2 is a block diagram of the failure prediction method.

FIG. 2 is a block diagram of the failure prediction system. As shown in FIG. 2, the physical drive includes a variable speed drive 121 (VSD) connected to a motor 122 which in turn drives a load 123.

The system comprises various sensors which are configured to measure various parameters including the measured current applied by the VSD 121 to the motor 122 and speed of the motor 122. In this case, the system also comprises a controller configured to determine other parameters including an estimated speed of the VSD and an estimated torque of the VSD (Specification 112-1991-IEEE Standard Test Procedure for Polyphase Induction Motors and Generators URL: https://ieeexplore.ieee.org/document/210975). These measured or calculated values, along with the reference speed are provided to the data acquisition unit 116 of the failure prediction system.

As illustrated in FIG. 2 the failure prediction includes the following subsystems.

System Identification Unit

Figure 3:
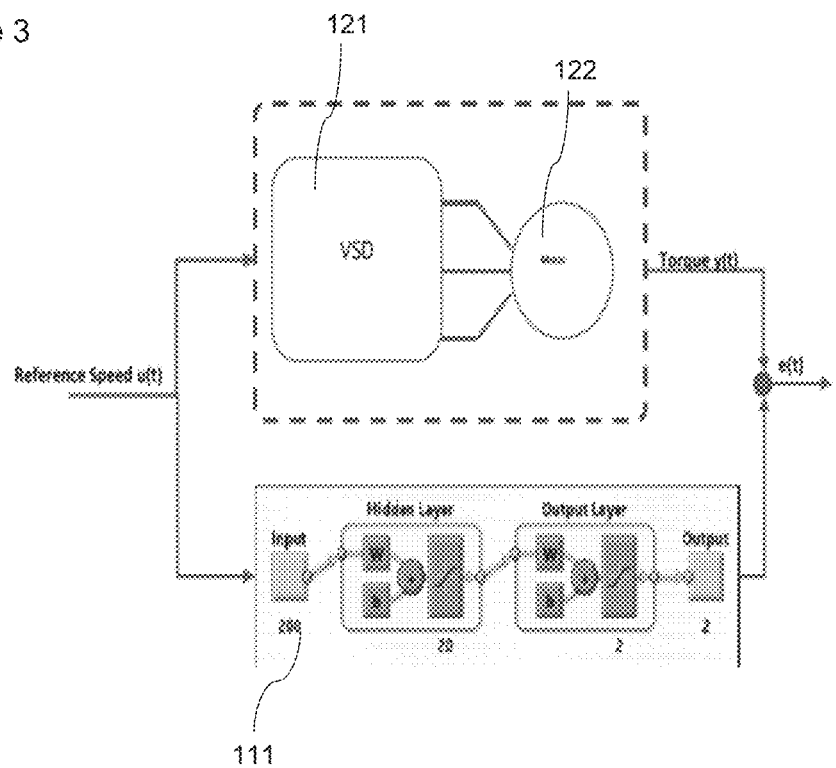
FIG. 3 is a block diagram of the offline system identification.

The system identification unit 111 (which may operate online or offline), as illustrated in FIG. 3, is used to identify the healthy model of the VSD 121 and motor 122 and drive train. FIG. 3 is a block diagram of the offline system identification unit. In this case, the system identification unit is an artificial neural network (e.g. a general dynamic neural network) is used to learn the healthy nonlinear dynamics of the system. To capture the nonlinear dynamics of the system, general dynamic neural network (GDNN) is used. Because of the recurrent structure of GDNN, they show superior ability to capture the dynamics of nonlinear systems. However, any other types of the neural networks might be used in this part (e.g. Jordan, Elman networks or even multilayer perceptrons and feedforward networks).

Figure 4:
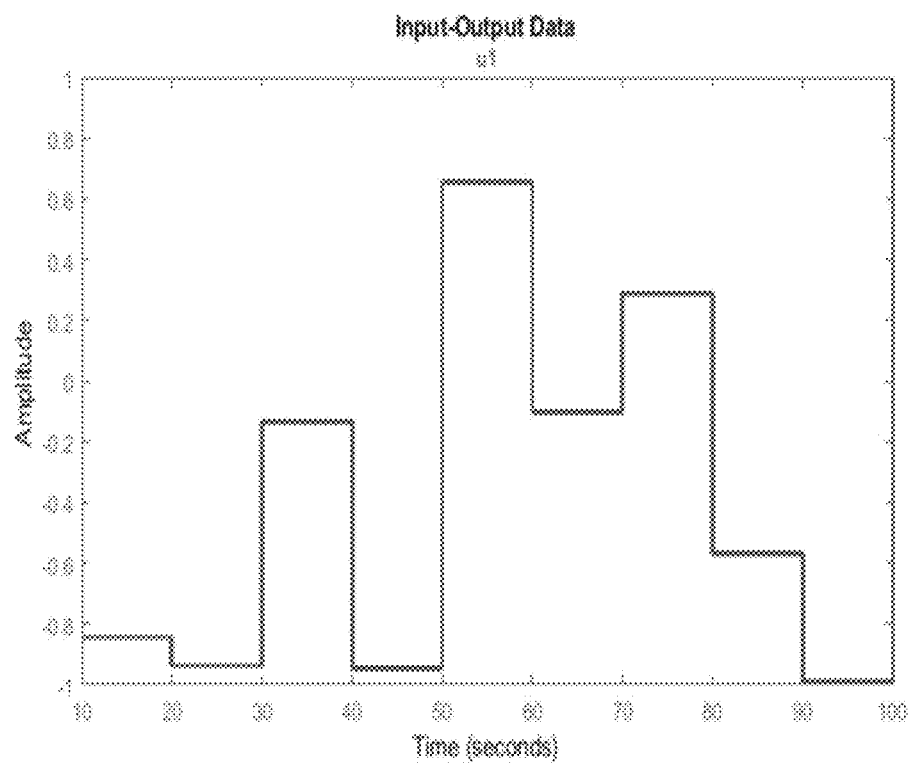
FIG. 4 is an Amplitude Modulated Pseudo Binary Signal (AMPSBS) is applied to reference speed as an excitation signal for system identification.

As illustrated in FIG. 4, a pseudo random signal modulated over a random amplitude signal is used to excite the system nonlinear dynamics over different frequencies. The signal not only need to excite the nonlinear dynamics but also need to be smooth enough to avoid any damage to the system. The method incorporates different safety measures to tailor the excitation signal to the application. For example, the system may use the pseudo random signal as an excitation signal (e.g. speed) to build the healthy model of the system. Using a pseudo random signal may provoke a more accurate system response than, for example, measuring the response while incrementally increasing the speed across the speed range. This is because the pseudo random signal may help avoid issues where the system response is dependent on how the system was running in the recent past (e.g. due to hysteresis or backlash).

The high frequency output motor torque is used as the output data for the training of the neural network. The torque signal may be measured directly from the motor shaft. In other embodiments the torque can be estimated from the VSD.

In other embodiments, the motor current can be alternatively used as output signal to train the neural network.

In some embodiments a percentage (e.g. 70%) of the set of excitation RPM as input data and high-resolution torque signal as output data is utilized to train the algorithm. The rest (e.g. 30%) of the set of input and output data is utilized for validation. The method generates a Pass or Failed Score. For example, the 30 percent set of input/output is used to verify that the system can predict the response. If the network output is matched (>98%) the system is deemed to have passed the verification. Otherwise, it has deed to have failed. In case of a Fail, the training should be repeated.

Feature Extraction

The feature extraction unit 113 identifies the frequency components of the torque signal. This step applies a form of Fourier transform (e.g. FFT, Short time Fourier transform, Welch power spectral, DFT, Spectrogram, etc.). For FFT, the frequencies are identified by their amplitude. For STFT (Short Time Frequency Transform), the frequencies are identified at a particular time by the energy of each frequencies.

Classification Unit

The classification unit 112 uses a form of classification/regression methods (e.g. KNN, SVM, Regression, decision tree, etc.) to predict the likelihood of the time to failure (or the time to maintenance) based on the deviation of the frequency components from that of a healthy status. The classification unit, in this case, displays a predicted time in a form of a confusion matrix in the form of short, long, and urgent.

The system in this case is configured to identify deviations across a range of harmonics. For example, a fault may give rise to a deviant signal about a high harmonic first, followed by growing deviant signals in successively lower and lower harmonics. How these deviant signals grow over time over the various harmonics can be used to estimate how long the system can operate before the fault becomes serious.

The classification unit may also compare the sub-harmonics of the frequency spectrum with a fault database 112a scenario to identify the cause of failure. The fault database scenario typically exists for different rotary systems (e.g. see the belt conveyor case study below).

One characteristic feature of fault detection systems is that the cost associated with the missed fault (no detection when a fault occurs) is several orders of magnitude higher than the cost of a false alarm (detection when no fault occurs). This implies that system should be made extremely sensitive, tolerating frequent false alarms. However, the probability of a fault is usually (hopefully) several orders of magnitude lower than the probability of the nominal case. Thus, this compensates for the above-mentioned effect. Too many false alarms will certainly result in fault detection system being switched off. The sensitivity of the proposed technique can be adjusted using a cost function associated to the confusion matrix.

Another aspect of the present technology is a failure prevention method. The failure prevention consists of an online load impedance estimator and an impedance matching method. The impedance matching method adjust the electrical impedance of the variable speed drive with respect to the estimated mechanical impedance of the load.

Failure Prevention
Parameter Estimation

Figure 5:
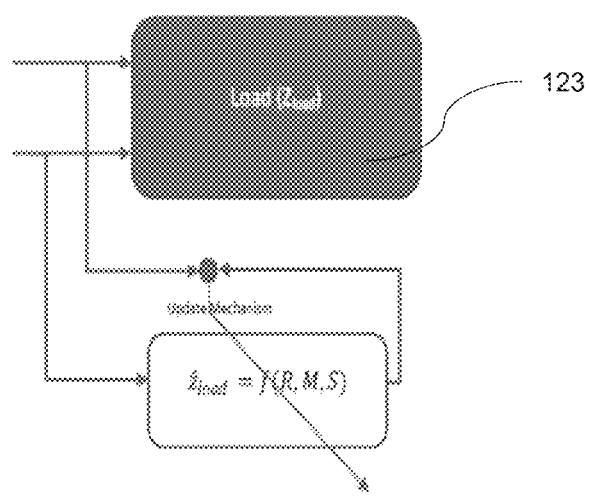
FIG. 5 is a block diagram of a parameter estimator.

In this case, an online parameter estimation is used to identify the parameters of the load. The objective is to estimates the mechanical impedance of the load as follows:

$$Z_{load} = \frac{T_{load}}{\Omega_{load}} = R + \left(M\omega - \frac{S}{\omega}\right)i$$

where R, M and S denote the mechanical resistance, or dampening, mass and stiffness of the load respectively; $\omega=2\pi f$ denotes the angular frequency and i is the imaginary unit. Assuming the drive is running on stiff gains (the default gains), the torque on the motor (either the filtered electromagnetic torque of the drive or the measured torque on the motor shaft) is equal to mechanical load torque, $T_{load}$, and the delivered speed is equal to the load speed, $\Omega_{load}$. FIG. 5 illustrates the online parameter estimator. The speed and torque can be either directly measured or calculated based on the motor voltage, flux and currents. In this case, the parameter estimator uses a recursive error correction method (e.g. least square method) to estimate mechanical impedance of the load.

FIG. 5 shows that the system is configured to collect the wide-frequency range speed and torque, building the impedance model explained in the equation above for the mechanical impedance of the load. R, M and S are updated (as illustrated by downward arrow) over time.

Impedance Matching Unit

Figure 6:
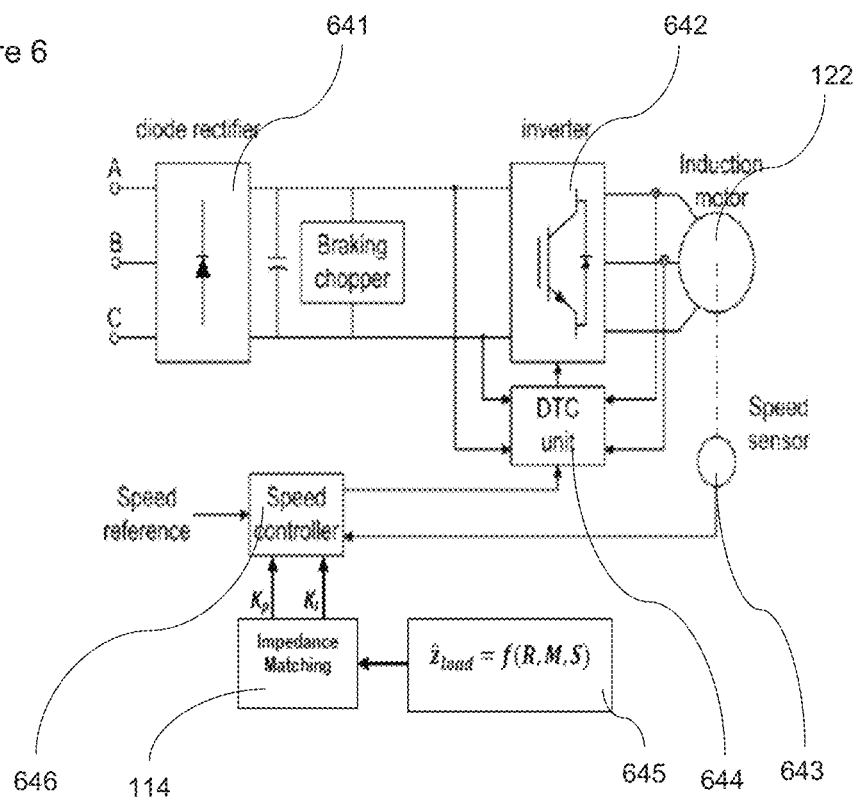
FIG. 6 is a diagram of the failure prevention used as an impedance matching method based on the estimated load impedance.

FIG. 6 shown an embodiment of a motor 122 which uses an impedance matching unit 114 to limit or prevent damage. The motor is powered by a three-phase power A, B, C. This input is rectified by a diode rectifier 641, and then inverted by an inverter 642 to change the direct current (DC) to alternating current (AC). The alternating current is provided to an induction motor.

On the control side, the speed of the motor is measured by a speed sensor 643 which is fed to a speed controller 646. A direct torque controller 644 (DTC) is used to control the torque (and ultimately the speed) of the AC electric motor 122. The DTC receives voltage and current values of the power provided to and from the inverter and speed control information provided by the speed controller 646. The speed controller in turn receives information corresponding to the desired speed (a speed reference value) and to the actual speed of the motor (a speed sensor value).

As shown in FIG. 6, the impedance matching unit 114 interacts with the speed-controller (a PI controller in this case) of the VSD based on the parameters of the load estimated by the parameter estimation unit 645. To this end, the method tunes the electric impedance of the VSD based on the estimation load impedance. The electrical impedance of the drive which denotes the relationship between the output torque, T [in Nm] and speed, $\Omega$ [in Rad/Sec] can obtain as follows:

$$Z = \frac{T}{\Omega} = k_p + \left(k_I\omega - \frac{I}{\omega}\right)i$$

where $k_p$ and $k_I$ denotes the speed loop proportional and integral gains; $\omega$ denotes the angular frequency of the drive, i is the imaginary unit, and l (in Kg·m$^2$) denotes the effective mass moment of the inertia of the motor and gearbox.

The impedance matching unit for a harmful frequency, $\omega_H=2\pi/f_H$ calculates the $K_p$ and $K_I$ as follow:

$$k_I=(I+M)\omega_H^2-S$$

$$K_p=R$$

Figure 7:
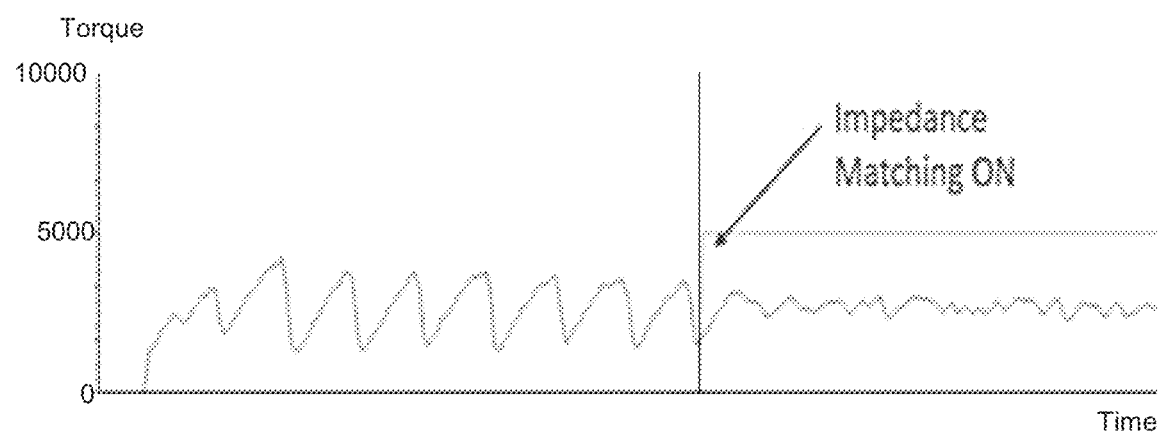
FIGS. 7 and 8 are graphs showing the result of the impedance matching the system has more dampening to prevent the likelihood of failure.
Figure 8:
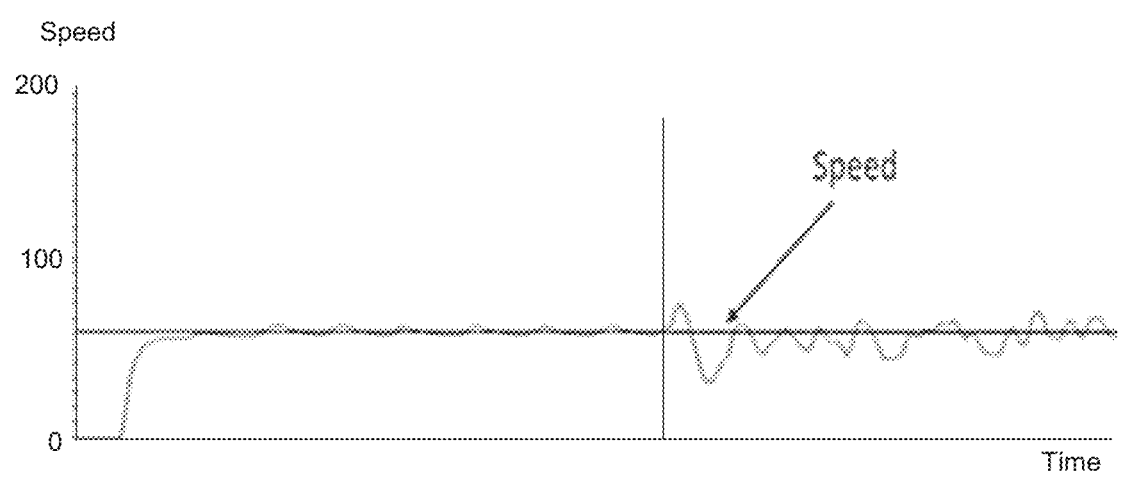

As illustrated in FIGS. 7 and 8, the most notable effect of this method is the smooth torque profile despite slight fluctuations on delivered speed around the reference speed. The method decreases the vibration and energy consumption and increases the transfer of energy to the load and the life of equipment.

Case Study I: Electric Submersible Pumps

The results shown in FIGS. 7 and 8 are taken from an electric submersible pump (ESP) embodiment. How the system is used in conjunction with an ESP will be described in greater detail below. It will be appreciated that other embodiments may be used with other rotating electrical machinery.

The present system may be used as a condition monitoring and resonance mitigation method for electric submersible pumps (ESPs) and other Rotary Electric Machinery (REM) based on motor intelligence. Condition monitoring has been an integral part of surface pumps. Nonetheless, majority of ESPs may only have a motor phase current and a process-related measurement, which do not directly indicate the operation efficiency and mechanical reliability. This gap is mainly due to the harsh operating environment for ESPs. The present disclosure relates to a condition monitoring method based on the motor intelligence available at the wellhead to detect the electrical, mechanical and process related issues. The resonance mitigation method is based on adaptive tuning of the control parameters in the electric drives. The case study shows the success of the condition monitoring method on detecting the electrical and mechanical faults on a VSD driven submersible pump.

Electric submersible pumps, typically called ESPs, are an efficient artificial lift method for lifting moderate to high volumes of fluid from wellbores to surface. During the past decade, the run life of ESPs has significantly improved, in some applications such as SAGD to more than double, due to improvement in its manufacturing and the best practices. However, still ESP's failures each year cost producers unwanted downtime, equipment replacement cost and deferred production value. Furthermore, ESPs are one of the biggest consumers of energy in oilfields. Hence, operation efficiency and mechanical reliability of these equipment remains of important topics in both research and engineering communities.

Even though condition monitoring has been an integral part of surface pumps, majority of ESPs may only have a motor phase current and a process-related measurement, which do not directly indicate the operation efficiency and mechanical reliability of the ESP. The main reason for this gap is the extreme harsh conditions downhole which require extremely robust sensors. The other reason is the limitation on downhole communication due to factors such as limited bandwidth, long delay, and high EMF noises.

A comprehensive study conducted by the U.S.A Department of Energy on vertical submersible pumps for monitoring and diagnostics (EPRI NP-5704M) [1]. The report shows that many vibration related issues and faults may be missed or misdiagnosed depending on the displacement of the sensors. They showed installing the sensors on the motor is not sufficient. It is necessary to mount the sensors on the submerged portion of the pump. Furthermore, because of the axial rotations of the pump, the data from 3-axis vibration sensors are not reliable. They also reported significant failures on sensors. This emphasizes the fact that a cost-effective condition monitoring solution for ESPs requires to be based on the wellhead signals.

As noted above, a motor current signature analysis is a condition monitoring technique used to diagnose problems in induction motors. The main advantage of this technique over other condition monitoring technics is that it does not require direct access to the motor or associated load. As a result, this type of monitoring is especially attractive for applications located in remote and harsh environments such as ESPs electric pumps, mobile mining equipment, compressors etc. The underlying concept is to use the sensitivity of the electric motor to even minute fluctuations on motor load. Any faults and vibrations that increase motor load are independent of the distance from the motor and can be detected on the motor current.

This section describes how the combination of digital signal processing on the motor's current and voltage and physics-based model of a fault provides a diagnostic tool for REMs. Motor intelligence may be used to detect anomalies in mechanical (e.g. unbalance, misalignment, shaft eccentricity and instability, etc.) and electrical (e.g. loose windings, short circuits, voltage and current imbalances and power factor, etc.) as well as process related anomalies such as cavitation.

Load-Based Analysis

Figure 9:
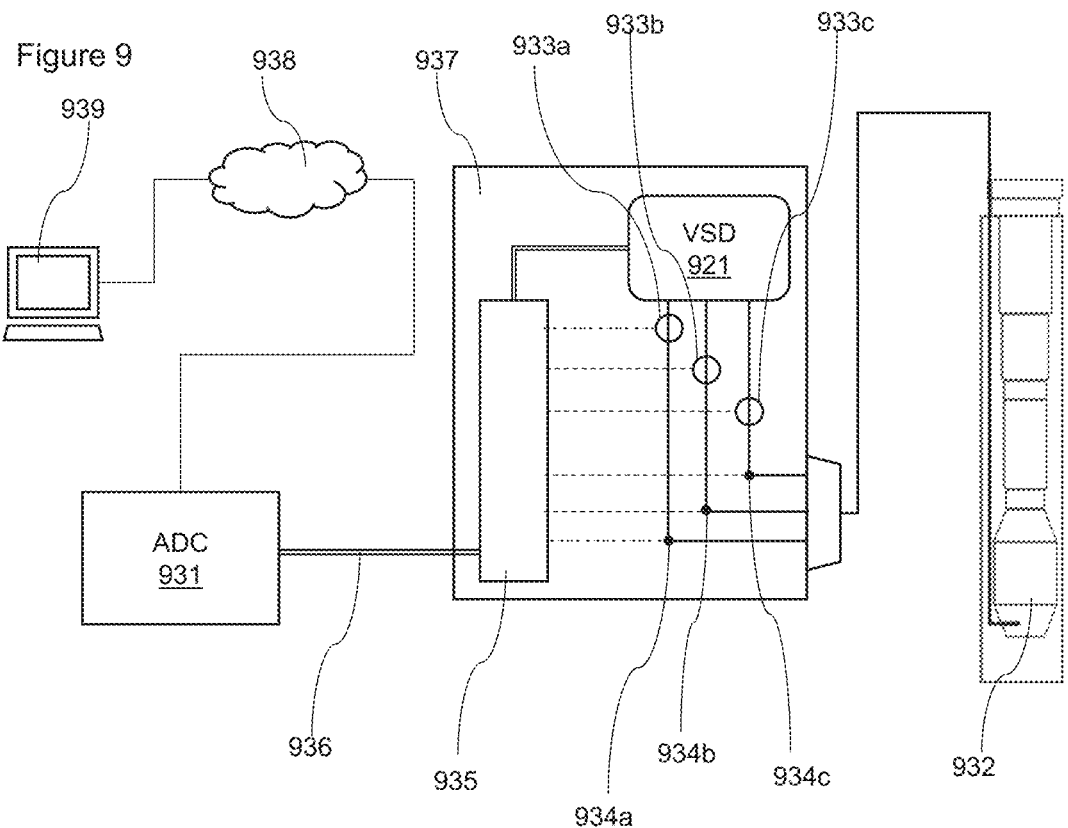
FIG. 9 is a schematic diagram of the system as applied to a submersible pump.

FIG. 9 shows a block diagram of the system hardware. The electrical drive comprises a variable speed drive 921 ("VSD") and is part of an artificial lift system, which comprises downhole equipment inserted into a production well (not shown). The downhole equipment includes a number of components attached to production tubing, including a pump and a pump motor 932 mechanically coupled to the pump. The pump in this embodiment is an electrically submersible pump, and alternatively can be another type of electrically driven pump known in the art such as a progressive cavity pump, a hydraulic pump, and a rod pump. A power cable extends from the VSD and into the well to couple to the pump motor.

The sensors inside the motor control panel measures the 3-phase currents and voltages, converts them to Ethernet and communicates to the ADC using Ethernet IP protocol.

This system measures 3-phase currents using wideband current sensors 933a-c installed in the motor control panel 937. The wideband is referring to the frequency response of the sensors that covers the low to high frequencies. These sensors are installed around the motor cables, as illustrated in FIG. 9. Three potential transformers 934a-c (PTs) are utilized to capture the 3-phase voltages. A small convertor 935 is designed to receive the analog signals and to send them out of the motor switchboard to an analog-to-digital convertor 931 (ADC) via a transmission line 936. The convertor may comprise an analog to analog conversion of the received signals (e.g. using an operational amplifier circuit).

The transmission line is an Ethernet cable in this case, but other embodiments may use fibre-optic cables.

By using the transmission cable 936, the high voltage environment can be separated from the low voltage environment. The ADC may be located at least 1.5 m from the switchbox and the high voltage components. This limits the damage and EM interference with the processor. The transmission line also allows an analog signal to be transmitted outside the switchbox, where a powerful processor can convert to a digital signal without losing resolution.

The ADC 931 (and any connected processors) should ideally be run on battery. Otherwise, a differential loop may be created.

The ADC 931 is then configured to convert the signal to a digital form to be transmitted to a remote computer 939, possibly via the cloud 938.

Figure 10:
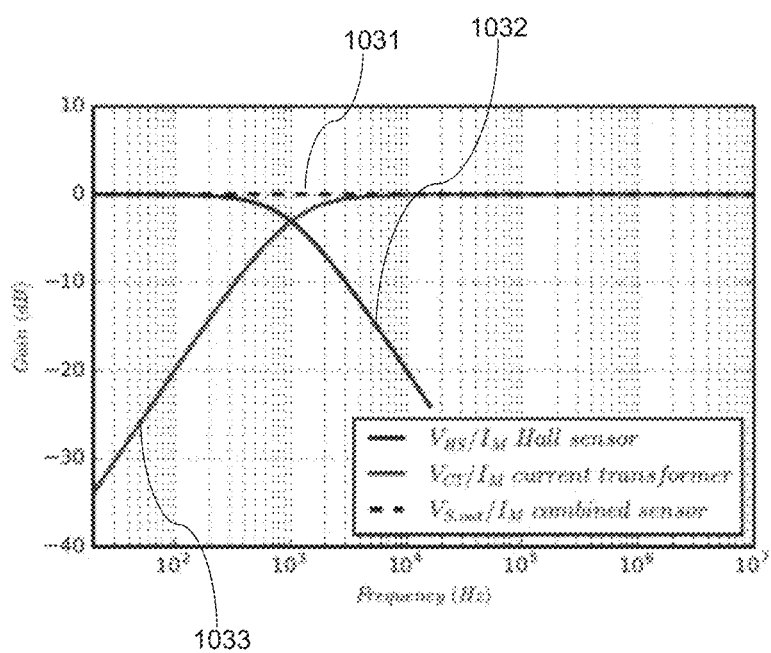
FIG. 10 is a graph of the frequency response of the sensors.

One of the advantages of this configuration is that it allows continuous monitoring without opening the high voltage panel door of the switchboard 937. This fully complies with the National Electrical Code (NEC) for energized operating equipment. In machinery vibration analysis, velocity meters are often used to capture low frequency vibrations and accelerometers for high frequencies. Wide band sensors allow capturing of the full range of vibrations from low to high frequencies in a continuous manner. FIG. 10 shows the frequency response of the sensors.

FIG. 10 gives the frequency response of the wideband sensors is depicted by the black dash line 1031. The frequency response of the Hall sensors is shown by line 1032 and the frequency response of the current transformer is shown by line 1033. For voltage measurements, in this case, there are 3 potential difference meters that convert high voltage to a corresponding signal of between 0 to 10 Volt. This reduced signal can be transmitted outside the control panel safely, and does not interfere with other electronics.

In this embodiment, the hardware receives the analog signals over Ethernet and digitizes them. Thereby, various digital signal processing techniques in time, frequency and time-frequency may be applied for diagnostic. For instance, in time domain unbalanced current and voltage, inrush and transient current can be detected.

Most of the mechanical faults can be identified by examining the frequency domain or, in other words, the power spectral of the current and voltage. A typical process is to first search for the large peaks in frequency spectrum that are not running speed, pole passing or vane passing frequencies. The remaining peaks may be the response of mechanical load connected to the motor such as bearing defect, resonance on shaft, impeller imbalance, etc. There may also be several harmonics associated with them. If this is the case, it could be an early indication of a mechanical fault.

At this point, the domain knowledge and physics-based model of a fault is typically required for the diagnostic. The specific component generating these frequencies can often be found by knowing the load system and calculating the expected frequencies, or speeds, of each item. There are frequencies generated neither from mechanical nor from electrical components. In this case, these frequencies are coming from the power supply. The source of these frequencies could be either from other equipment on the same line or bad power quality. This point emphases the fact that for condition monitoring the current itself may be insufficient. Both current and voltage should be monitored.

During the analysis, several functions occur to determine what problem exist in an ESP. The large number of peaks, normally found in high frequencies, makes it necessary to eliminate peaks normally through a carful process of elimination. First the power harmonic peaks are found and eliminated. Next, the rotor bar and stator slot passing peaks are found and eliminated. Finally, any peaks that remain are either coming from the power supply or from a mechanical fault. For instance, in the case of a bearing damage, if the center of the remaining peaks is not an integer multiples of running speed, then it represents a bearing defect frequency harmonic. The on set of a degradation can be found on high harmonics such as 15th to 20th.

Tables 1 to 3 summarize some of the electrical mechanical and process related faults in ESPs.

TABLE 1

Electrical Problems

| Faults | Detection from Motor Intelligence | Possible Effect |
|---|---|---|
| Unbalanced Voltage | More than 3% unbalanced warning, more than 5% alarm | Temperature rise of the motor |
| Unbalanced Current | More than 3% unbalanced warning, more than 5% alarm | Motor damage |
| Harmonic distortion; Power factor | Phase of voltage and current | Overheating, and retarding the motor operation |
| Input to output Horsepower Ratio | Real power (KW)/Estimated output horsepower | Windage losses, friction losses, motor efficiency |

TABLE 2

Mechanical Problems

| Faults | Detection from Motor Intelligence | Possible Effect |
|---|---|---|
| Misalignment, Bad Installation | "Finger" patterns at high frequencies in the current spectra | Cause static eccentricity of the shaft |
| Resonance | Peaks on current spectra (or estimated torque) around natural frequencies of the ESP | Cause Dynamic eccentricity of shaft, bending rotor |
| Bearing degradation | Non-integer sidebands around the running speed harmonics (e.g. 20$^{th}$ harmonic for on-set) | High vibrations, low efficiency |
| Stator, rotor damage | Calculation found in [2] | Vibration, motor fail |

TABLE 3

Process Related Issues

| Faults | Detection from Motor Intelligence | Possible Effect |
|---|---|---|
| Cavitation, Flash point | Low-frequency (0-5 Hz) variation in the shaft torque | ESP damage |
| Flow Turbulence | Low frequency broadband (0-1000) broad band excitation on current spectra | ESP damage |
| Flow Pulsation | Number of vanes times rotational speed | ESP damage |

ESPs structural model can be best described by simply supported or cantilevered beam. These systems are susceptible to structural resonance and torsional vibrations. Resonance is a condition in which an internal or external cyclic forcing function occurs at a frequency near one of the structure's natural frequencies. When this condition occurs the system lateral, torsional or axial vibrations amplifies sometimes up to 15 to 20 times larger than in a non-resonant condition. This sever oscillations may damage the protector and in worst cases the integrity of the well.

For the simplicity, the beam model may be reduced to a lumped spring-mass model. The mechanical dynamics of the ESP system are modelled as a torsional mass spring damper. The model of the drive and motor can be represented as:

$$J_{motor}\frac{d\Omega}{dt} + Kp(\Omega_{Set} - \Omega) + K_I \int (\Omega_{Set} - \Omega) = T_{load} \qquad (1)$$

where $\Omega_{Set}$, $\Omega$ (rad/Sec2) are the reference speed and the delivered speed respectively; $J_{motor}$ (kg·m2) is the inertia of the electric motor; Kp and $K_I$ represent, respectively, the proportional gain and the integration gain of the electrical drive (e.g. PI-controller), and $T_{load}$ is the mechanical torque generated in the load.

The system presented in Equation 1 and the mechanical dynamics of the ESP have very different response time or in other words mismatched impedance. On one hand, ESP has a slow response time and soft stiffness properties especially as the number of stages increases. On the other hand, the drive model especially due to VSD has very fast response time and high stiffness. This mismatch impedance is the main cause of torsional vibration induced failures in ESP systems.

The control method involves tuning the Kp and $K_I$ by adjusting a PI-controller in the VSD. This method is configured to calculate the stiffness of the load and measure the response time from the estimated mechanical torque. Based on these two parameters of the load, the PI-controller may be retuned in an adaptive manner to make sure both drive and the REM system have the response time and stiffness in a same order of magnitude.

FIG. 7 is a graph of estimated pump torque. The high ripples on the first part shows a resonance on the unit. The torque is fluctuating from an average of 3000 Nm to the maximum of 5000 Nm and minimum of 1500 Nm When the controller is ON (indicated by the red line).

As a result of the impedance matching, the system restores smooth operation and experience less torsional vibrations (although with a greater variation in speed). Motor current and estimated torque shows smooth operation as illustrated in FIG. 7. These measurement at the wellhead shows much less fluctuation which means smoother operation of the REM system.

Problem Identification

Another study is performed on an ESP with 100 HP induction motors driven by a variable speed drive. The initial problem was incrementing noises. The initial assumption was the improper installation of the pump.

Figure 11:
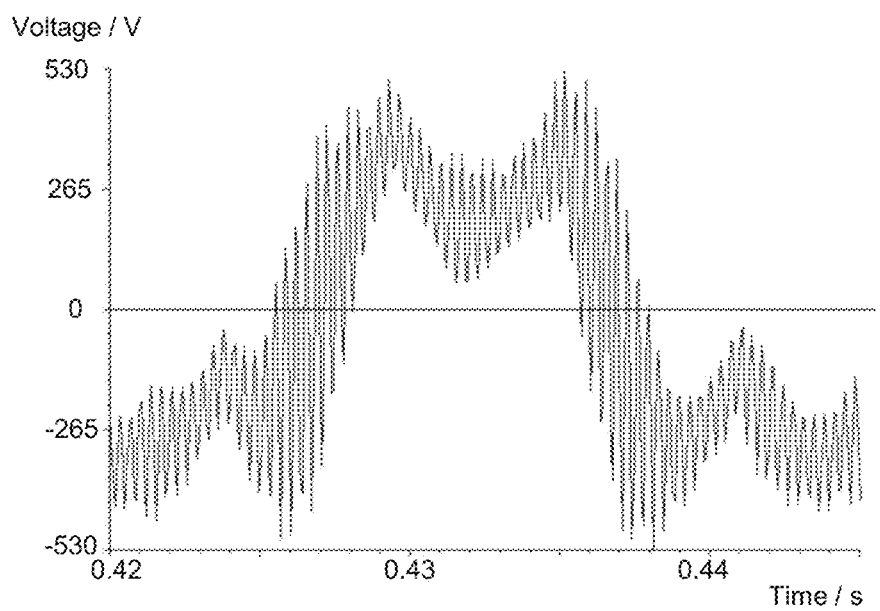
FIG. 11 is a VSD voltage time trace for one cycle.
Figure 12:
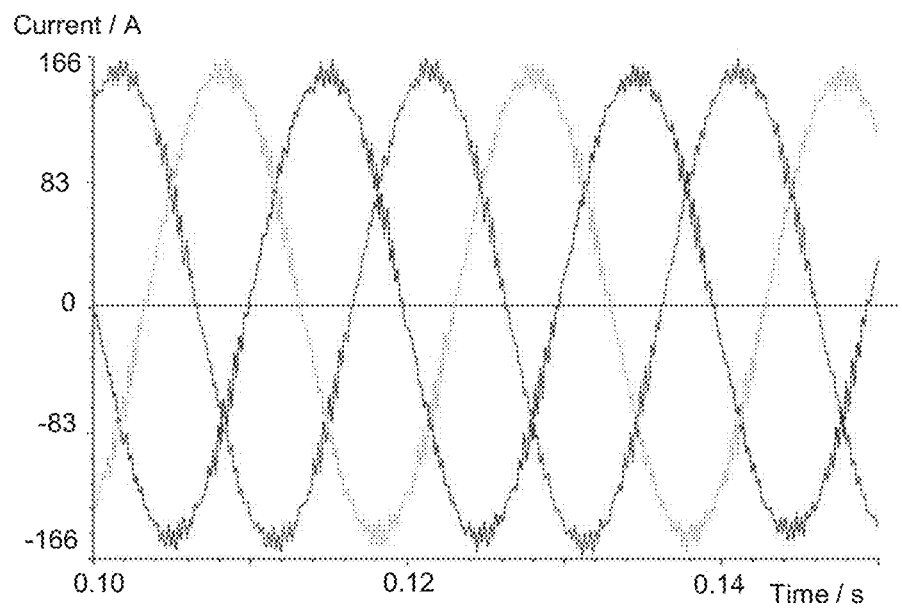
FIG. 12 is a graph of VSD 3-phase of current in time domain.

The 3-phase voltage and current data is collected at the switchboard's conductor connecting the power to the motor. The results are presented in FIGS. 11 to 14. FIG. 11 depicts a single cycle of the voltage waveform from the VFD. FIG. 12 shows several cycles of all three currents. FIG. 13a shows the voltage spectrum from 0 to 5000 Hz. FIG. 13b shows the current spectrum from 0 to 5000 Hz. All figures are when the VFD was set at 60.7 Hz during the over-voltage event that caused fibrillation.

Figure 14:
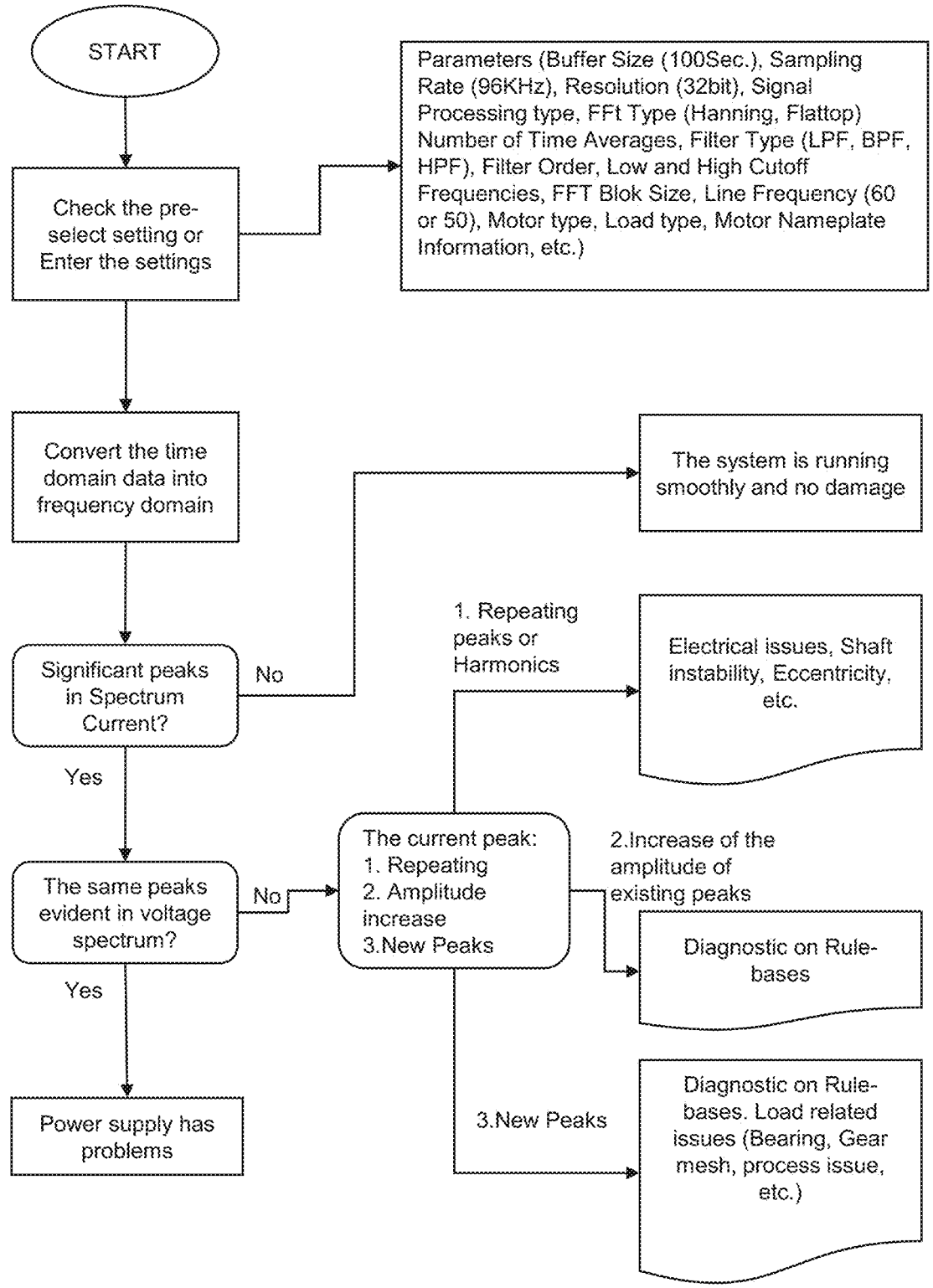
FIG. 14 is a flow chart showing how faults are identified.

The data showed a high ripple on the voltage which indicates the dominant problem is generated by power supply. Typically, when the voltage fluctuates, it impacts the current as well, but the converse is not true. That means if a peak is identified in current but not evident in voltage then that peaks is generated by an abnormal behaviour in the equipment. Peaks in voltage typically indicate issues in the power supply. This is shown in the flowchart of FIG. 14.

The initial data showed that voltages were being generated by the VSD that were 252 volts higher than normal for the motor. The VSD that was set at 60.7 Hz but had begun to fibrillate at 2975 Hz, denoted by arrow 1391 on FIG. 13b. This high frequency, high amplitude voltage was degrading the motor and had caused permanent damage to the motor by the time the data were collected.

The high voltage excursion had terminated, and the unit was operating normally. However, the second data taken at this time showed the electric power was causing the high vibration levels which corroborating the analysis.

In FIG. 13b, the two large peaks are marked at 1151.8 (arrow 1392) and 1252 (arrow 1393) centered at about 1200 Hz. Note that significant peaks near 1200 Hz are not evident in the voltage spectrum shown in FIG. 13a. These are the stator slot passing peaks indicative of stator mechanical damage. These two large stators passing peaks indicates the high amplitude voltage already damaged the motor stator. Only two peaks in this pattern makes it readily discernible from shaft eccentricity due to a bad installation which have many repeating peaks.

The results indicate the importance of monitoring both current and voltage; namely, if peaks are evident in the current that are not evident in the voltage, then the peaks represent a mechanical modulation of the current draw.

As noted above, the machinery vibration techniques that are common for surface pumps are not viable for ESP operation. The presented condition monitoring system is based on motors intelligence available at the wellhead. The hardware configuration allows a continues monitoring and capturing low to high frequencies in accordance to the electrical safety codes. Advantages include that the method can extract the mechanical, electrical and process related faults based on spectral analysis of the current and voltage. This method may be a cost-effective and efficient alternative for machinery vibration analysis for ESP applications.

Case Study II. Belt Conveyor System

Figure 15:
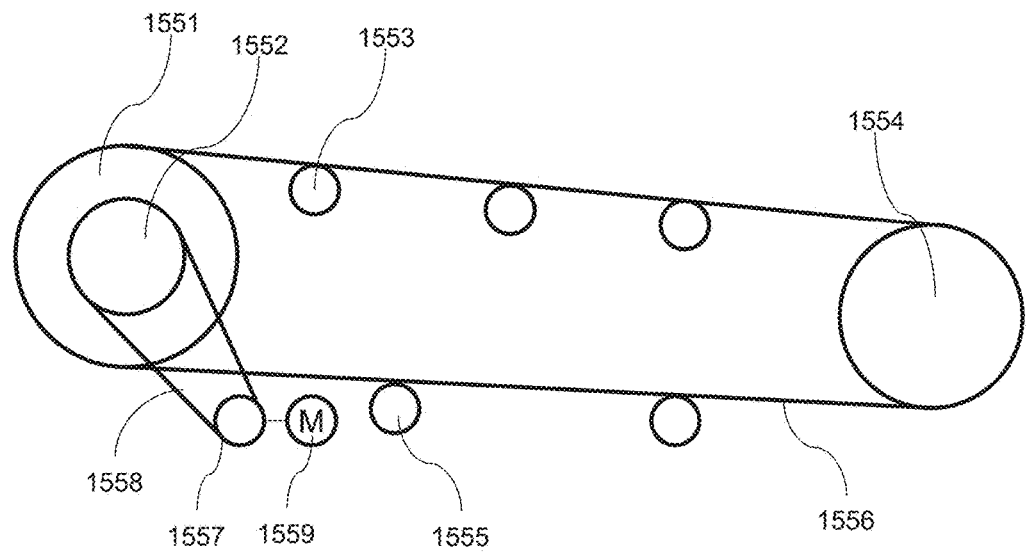
FIG. 15 is a diagram of a conveyor belt Rotating Electrical Machine (REM).

FIG. 15 shows an example of a conveyor belt system. In this case, the conveyor comprises a belt 1556 which spans between a drive wheel 1551 and a tail wheel 1554. The conveyor is supported at locations between the drive and tail wheels by upper 1553 and lower 1555 idlers. The drive wheel, in this case is driven by a motor 1559. The motor moves a small chain wheel 1557 which is connected to a large chain wheel 1552 by a chain 1558. The large chain wheel is connected rigidly to the drive wheel 1551 on a common rotation axis. The conveyor comprises a number of buckets (not shown).

To analyze this conveyor, the software searches through the current spectrum and locate the peaks tabulated in Table 4. The software detects deviation, changes in the amplitude and Sidebands around these frequencies. For instance, sidebands around chain and belt frequencies indicated flapping problem. Belt or chain flapping increases the friction, energy consumption and leads to belt/chain slipping.

The software monitors the condition of rollers and bearings. Table 5 shows where peaks would occur for the bearing on the small chain wheel turning at the motor speed. The on-set of the degradation can be detected on the high harmonics. Hence, Table 5 shows the frequency up to 20th harmonics. The same calculation would be preformed for the rest of bearings at their turning speed.

TABLE 4 frequencies of belt conveyor system

| Parameter | Input Source | Speed (Hz) | Speed (RPM) |
|---|---|---|---|
| Motor Speed 1559 | 60*f/p − slip speed | 29.7 | 1782 |
| Small Chain Wheel 1557 | $f_m * \frac{\text{Diameter}(MP)}{\text{Diameter}(SCW)}$ | 17.47 | 1048.23 |
| Chain 1558 | $f_{SCW} \frac{\pi * \text{Diameter}(SCW)}{\text{Chain Length}}$ | 3.34 | 200.91 |
| Big Chain Wheel 1552 | $f_{SCW} \frac{\text{Diameter}(SCW)}{\text{Diameter}(BCW)}$ | 7.42 | 445.5 |
| Drive Wheel 1551 | $f_{BCW} \frac{\text{Diameter}(BCW)}{\text{Diameter}(DW)}$ | 4.95 | 297 |
| Belt 1556 | $f_{BCW} \frac{\pi * \text{Diameter}(BCW)}{\text{Chain Length}}$ | 1.54 | 104.91 |
| Tail Wheel 1554 | $f_{TW} \frac{\text{Diameter}(BCW)}{\text{Diameter}(TW)}$ | 5.56 | 334.12 |
| Bucket Pass Frequency ($b_n$ = 8 number of Buckets) | $b_n * f_{belt}$ | 15.98 | 1049.15 |

In Table 4, MP, SCW, BCW, DW, TW and f stands for motor pully, small chain wheel, big chain wheel, drive wheel, tail wheel and frequency, respectively.

For the bearing on the motor shaft, the following table shows where peaks occur for degraded bearing.

The same calculation would be done for other bearings at their running speed.

TABLE 5 frequencies of the bearing turning at 29.7 Hz

| Bearing Multiplier (fd) | $f_d$ * RS | $f_d$ * RS + 60 | $f_d$ * RS − 60 |
|---|---|---|---|
| Fundamental Harmonic = 29.5 | | | |
| BPFI = 4.962 | 146.379 | 206.379 | 86.379 |
| BPFO = 3.036 | 89.562 | 149.562 | 29.562 |
| 2*BSF = 3.912 | 115.404 | 175.404 | 55.404 |
| BSF = 1.956 | 57.702 | 117.702 | −2.298 |
| FTF = 0.3792 | 11.1864 | 71.1864 | −48.8136 |

TABLE 5-continued frequencies of the bearing turning at 29.7 Hz

| Bearing Multiplier (fd) | $f_d * RS$ | $f_d * RS + 60$ | $f_d * RS - 60$ |
|---|---|---|---|
| 2nd Harmonic | | | |
| BPFI = 4.962 | 292.758 | 352.758 | 232.758 |
| BPFO = 3.036 | 179.124 | 239.124 | 119.124 |
| 2*BSF = 3.912 | 230.808 | 290.808 | 170.808 |
| BSF = 1.956 | 115.404 | 175.404 | 55.404 |
| FTF = 0.3792 | 22.3728 | 82.3728 | 37.6272 |
| ... | | | |
| ... | | | |
| ... | | | |
| 20$^{th}$ Harmonics | | | |
| BPFI = 4.962 | 2927.58 | 2987.58 | 2867.58 |
| BPFO = 3.036 | 1791.24 | 1851.24 | 1731.24 |
| 2*BSF = 3.912 | 2308.08 | 2368.08 | 2248.08 |
| BSF = 1.956 | 1154.04 | 1214.04 | 1094.04 |
| FTF = 0.3792 | 223.728 | 283.728 | 163.728 |

In Table 5, BPFI: Ball Pass Frequency of Inner ring, BPFO: Ball Pass Frequency of Inner Ring, FTF: Fundamental Train Frequency, BSF: Ball Spin Frequency.

Figure 16:
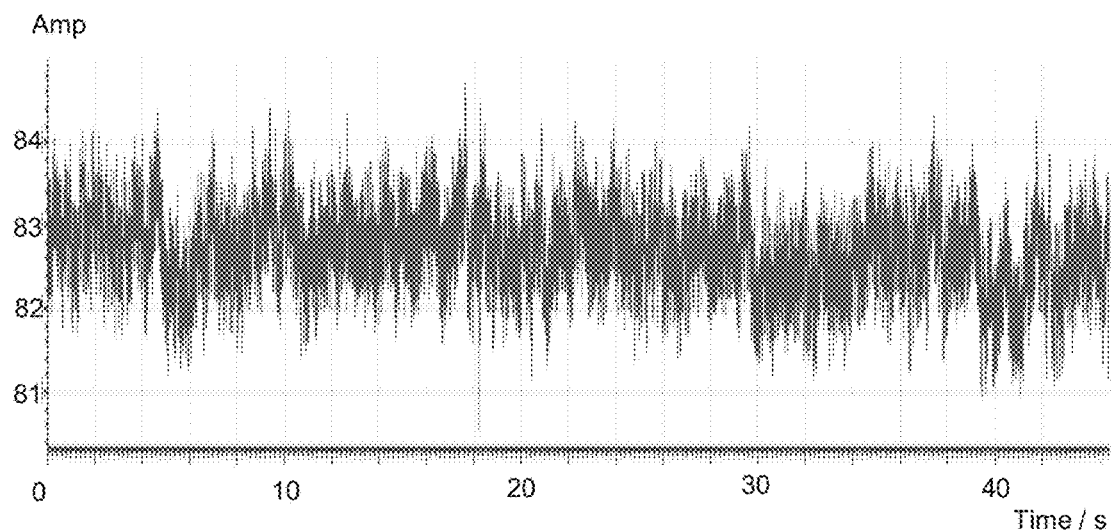
FIGS. 16-18 are graphs of experimental results for a conveyor.
Figure 17:
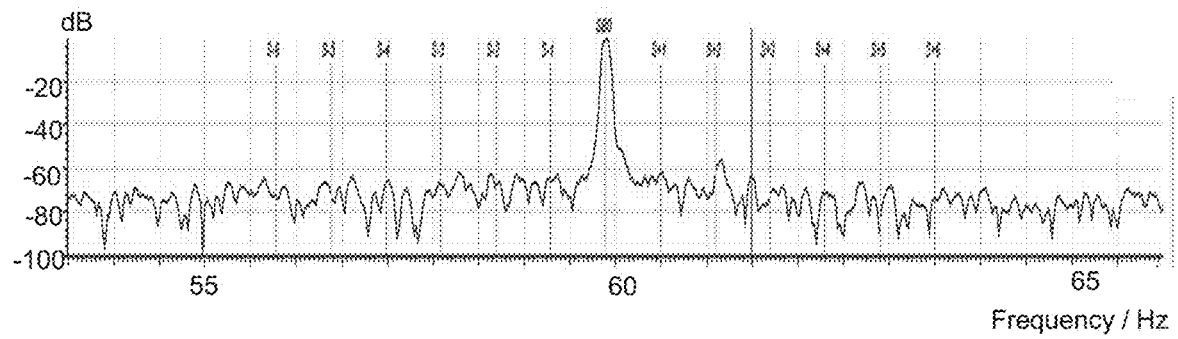
Figure 18:
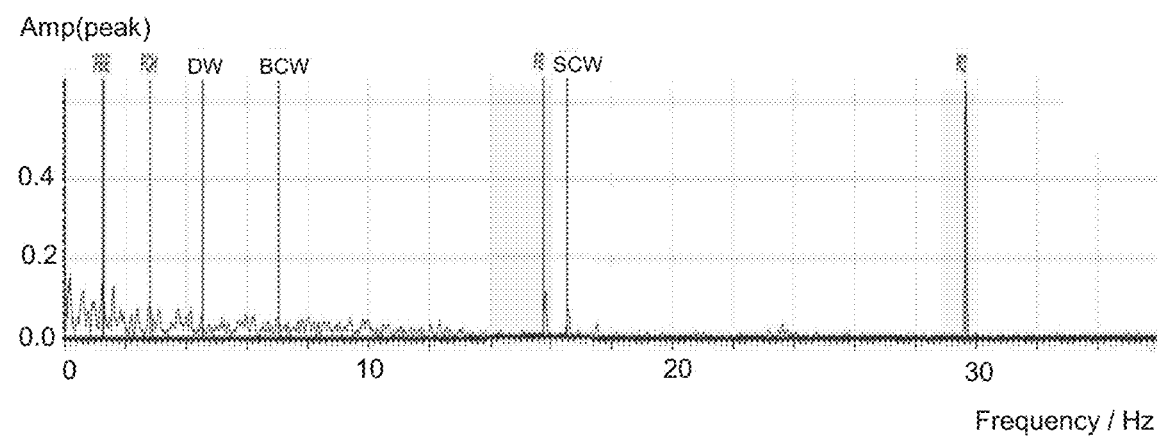

FIGS. 16-18 show experimental results for this conveyor. FIG. 16 shows 50 second of current sampled at 48K sampling rate per second. The data are time-averaged to reduce the random noise in the spectral data. The software monitors the change in amplitude and frequency of each of the calculated frequencies as well as side bands (labeled SB in the figure). FIG. 18 is a wide range of frequencies and FIG. 17 is shows the structure of a main peak and its associated side bands over a narrower frequency range.

For example, if a bearing on the small chain wheel was starting to wear, based on the geometry of a roller bearings, there are 4 multipliers that describe the mechanical vibration generated by the degradation of the bearing. This numbers may be the only real numbers in a rotary machine. Other parameters, e.g. motor rotors, stators, blades, poles, are integer. Hence, the software is looking for the non-integer sidebands around running frequency at high frequency current spectrum. Bearing damage is developed very quickly. Thus, the software is configured to determine that urgent maintenance is required upon detecting this non-integer frequencies in high frequency spectrum (e.g. 20th harmonics).

Case Study III: Gearbox Driven Electric Machine (Bucket Wheel Excavator)

Figure 19:
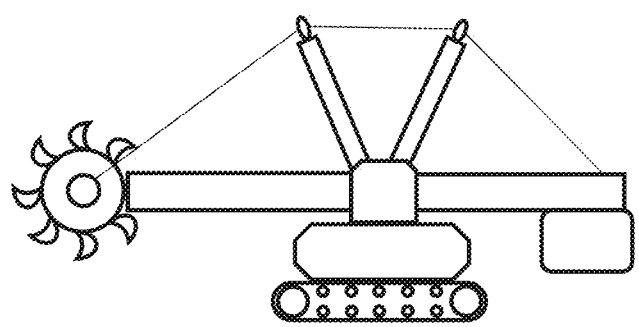
FIG. 19 is a diagram of a geared Rotating Electrical Machine (REM).
Figure 20:
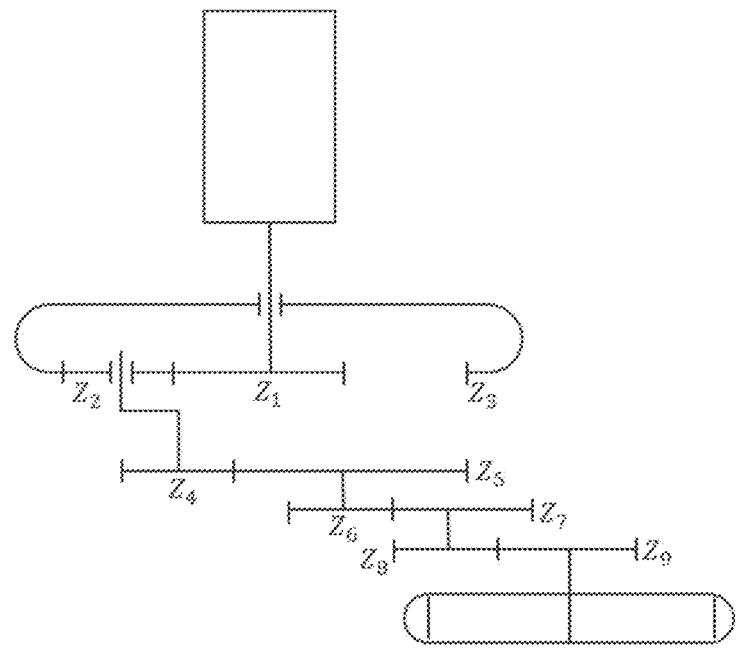
FIG. 20 is a diagram of the gearing of the REM of FIG. 19.
Figure 21:
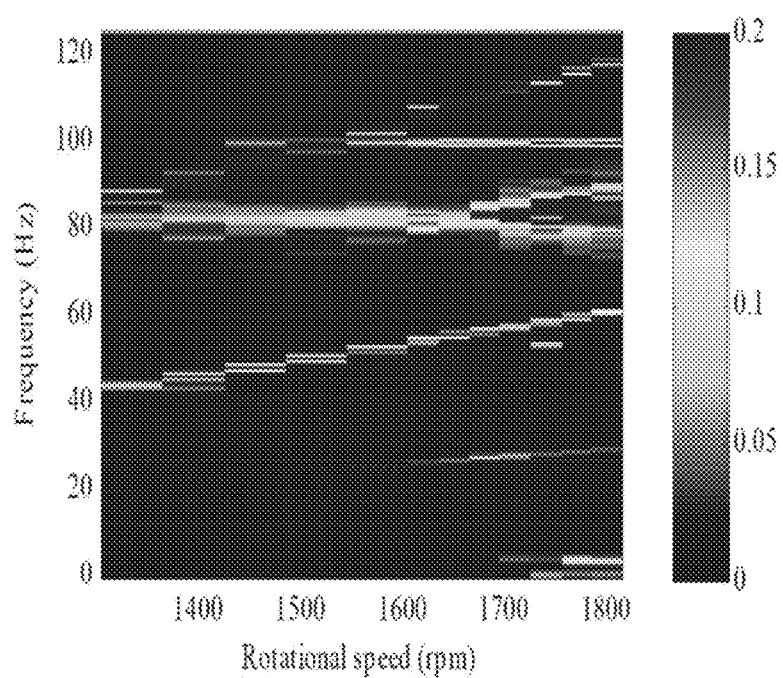
FIG. 21 is a graph showing how the frequencies change with rotational speed.

FIG. 19 shows a general overview of a bucket wheel excavator system in open pit mining. FIG. 20 shows the scheme of one driving system and an arrangement of 3 independent drives. The first stage gear is a planetary gear box consisting of a sun gear $Z_1$, planetary gear $Z_2$, and standstill rim gear $Z_3$.

There are three cases of planetary gear element rotation. In the presented case, the sun gear is rotating the planetary gear and rim gear is stationary, as represented in FIG. 20.

If, for example, the bearing on the $Z_1$ gear lost a tooth, the procedure for the diagnosis is to look for meshing frequencies (for that gear) and its harmonics, together with sidebands amplitude and structure. The increment in the number and amplitude of sidebands indicates a gear fault condition. The spacing of the sidebands, i.e. the distance of the sideband to the mesh frequency, is related to their source. The source of gear faults could be changes in tooth stiffness due to local tooth fault (e.g. cracks), nonuniform tooth wear (pitting, spalling).

Figure 22:
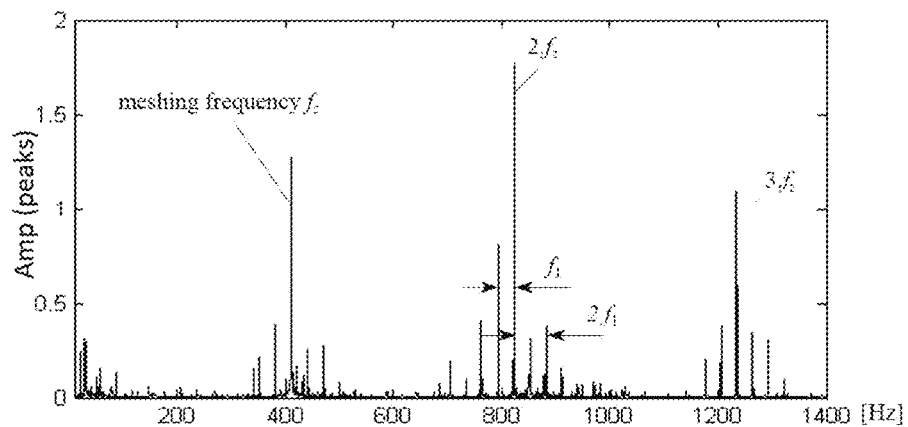
FIG. 22 is a graph showing the frequency spectrum of the REM of FIG. 19.

In this embodiment, the software generates a warning when it detects sidebands on the 10$^{th}$ to 20$^{th}$ harmonics of the calculated mesh frequencies. The software generates alarm for in-depth analysis of the gearbox when it detects sidebands either in less than 10$^{th}$ harmonics of the mesh frequencies or when the amplitude of the sidebands exceeds 3 percent of that of center mesh frequency. FIG. 22 shows the sidebands and harmonics up to 3$^{rd}$ harmonic of 435.06 Hz mesh frequency and some sideband frequencies.

The meshing and other characteristic frequencies of this system are presented in the following table. In this table, $f_{12}$ notes as meshing frequency for a pair of gear wheels marked as $Z_1$, $Z_2$, $Z_3$, $n_1$ is input rotational velocity (950 RPM).

TABLE 5

Frequencies of a Geared Rotational Electric Machine

| | | |
|---|---|---|
| Meshing frequency for a pair of gear wheels $Z_1$, $Z_2$ and $Z_3$ | $f_{12} = f_{23} = \dfrac{n_1 Z_1 Z_3}{60(Z_1 + Z_3)}$ | 950*39*93/60(39 + 93) = 435.06 Hz |
| The arm frequency | $f_{arm} = \dfrac{n_1 Z_1}{60(Z_1 + Z_3)}$ | 950*39/60(39 + 93) = 4.67 Hz |
| The rotational frequency of second gear (planetary ger) $Z_2$ | $f_2 = \dfrac{n_1 Z_1}{60(Z_2 + Z_2)}$ | 950*39/60(27 + 27) |
| Meshing frequencies for 3-stage cylindrical gearbox | $f_{45} = f_{arm} Z_4$ | $f_{45} = 4.67 * 34 = 158.78$ Hz |
| | $f_{arm} = f_{arm} \dfrac{Z_4}{Z_5} Z_6$ | $f_{67} = 4.67 * \dfrac{34}{117} = 57$ Hz |
| | $f_{arm} = f_{arm} \dfrac{Z_4 Z_6}{Z_5 Z_7} Z_8$ | $f_{89} = 4.67 \dfrac{34*42}{117*145} = 13.75$ Hz |
| The bucket frequency ($b_n$: number of buckets 11, $T_w$: rotation period 20s) | $f_b = \dfrac{b_n}{T_w}$ | 11/20 = 0.55 Hz |

The software is configured to search for these frequencies and their harmonics. A list of frequencies may be published for a particular rotating electric machine. Besides this mesh frequencies, the software is searching for the local faults which can be identified as side band components in current spectrum. Local faults originate from a tooth crack, tooth breakage, a spall on a tooth flank.

$$f_{1l} = \frac{n_1 S Z_3}{60(Z_1 + Z_3)} = \frac{950*3*93}{60(39+93)} = 33.4 \text{ Hz}$$

$$f_{2l} = \frac{4 n_1 Z_1}{60(Z_3^2 - Z_1^2)} = \frac{4*950*93}{60(93^2 - 39^2)} = 32.2 \text{ Hz}$$

$$f_{3l} = \frac{n_1 S Z_1}{60(Z_1 + Z_3)} = \frac{950*3*39}{60(39+93)} = 14 \text{ Hz}$$

Figure 23:
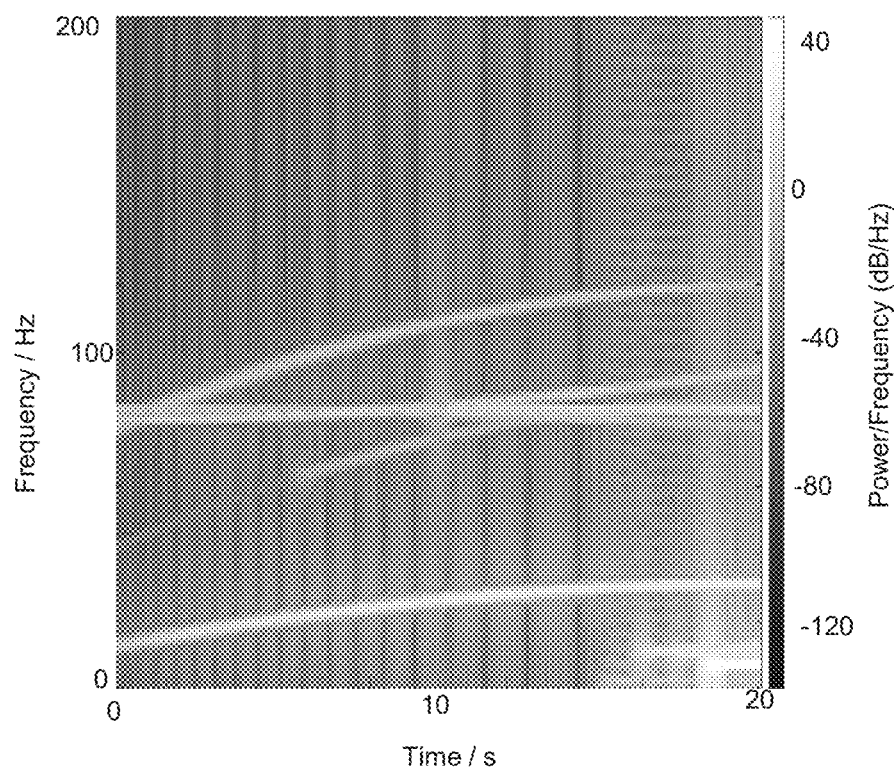
FIG. 23 is a graph of a Short Time Fourier Transfer (STFT) of the motor current over 20 second of data sampled at 48 KHz with 32-bit resolution.

FIG. 23 shows a Short Time Fourier Transfer (STFT) of the motor current over 20 second of data sampled at 48 KHz with 32-bit resolution. The notable frequencies are running speed (18-30 Hz), running speed harmonic (46-60 Hz), Blade pass frequency which is four times of the running frequency (76-120), energy of the rotor shaft which fluctuating at the high speed, the low frequency between 0 to 10 Hz indicated the poor pump operation which may indicate the cavitation at the pump.

FFT is a power method of analyzing stationary signals. Nevertheless, there are cases in rotary machinery applications that the signal is changing by time or, in the other words, showing non-stationary behavior. Non-constant speed is one of these applications. Short Time Fourier Transform (STFT) divides a longer time signal into shorter segments of equal length and then compute the Fourier transform separately on each shorter segment that have stationary behavior. One then usually plots the changing spectra (frequencies) as a function of time and the density of the color represent the energy (power per frequency) known as a spectrogram.

As illustrated in FIG. 23, the rotational RPM of the pump is increased from 1080 to 1800 RPM (18-30 Hz). The bald pass frequency is changing from 76 to 120 Hz. The energy of the shaft is concentrated around 85 Hz due to the coupling of motor shaft and pump. As the speed increases, the second rotational speed harmonic become more notable which reflects the high vibration on the pump. The energy of shaft starts fluctuating and some low frequency noises are observed between 0 to 10 Hz when the speed passes 1600 RPM. This indicate the poor pump operation and may indicate that cavitation is occurring in the pump.

REFERENCES

The following documents are disclosed for reference:
[1] Walter, T. J., and Marchione, M. M. On-line vibration monitoring for submerged vertical shaft pumps: Final report. United States: N. p., 1988.
[2] R. Pragale, D Shipp, Investigation of premature ESP failure and oil field harmonic analysis, IEEE Trans. Ind. Appl., vol. 53, no. 3, May 2017.
[3] J. Shadley, B. Wilson, M. Dorney, Unstable Self-Excitation of Torsional Vibration in AV induction motor driven rotational systems, ASM Tran., vol 114, April 1992.
[4] S. Rabbi, T, Kahnamouei, X. Liang, J. Yang, Shaft Failure Analysis if Soft-Starter Fed Electrical Submersible Pumps Systems, IEEE Ind. Applications, 2019.

The invention claimed is:

1. A system for monitoring operation of an electrical drive of rotating electrical machinery comprising:
   analog sensors configured to measure electrical signals generated by the rotating electrical machinery, the measured electrical signals corresponding to a voltage and a current of the rotating electrical machinery; and
   a remote processor configured to receive the measured electrical signals and to identify frequency components independently in the measured voltage electrical signals and in the measured current electrical signals, wherein the system is configured to receive and/or calculate speed signals corresponding to a set speed and to an actual speed of the electrical drive, wherein the set speed is a target speed setpoint set by a controller of the rotating electrical machinery.

2. The system of claim 1, wherein the identified frequency components span the frequency range from 1 Hz to 1 MHz.

3. The system of claim 1, wherein the at least one of the voltage and current electrical signals is measured by a plurality of analog sensors, each analog sensor being sensitive to different frequency ranges.

4. The system of claim 1, wherein the analog sensors comprise: a current transformer; and a Hall sensor or a Rogowski coil.

5. The system of claim 1, wherein the frequency components of the measured electrical signals are identified by applying a time-frequency transform.

6. The system of claim 1, wherein the analog sensors are located within a high-voltage panel and the remote processor is located outside the high-voltage panel.

7. The system of claim 1, wherein the remote processor is battery powered.

8. The system of claim 1, wherein the processor is configured to identify a damaged component by associating an identified fault frequency with a harmonic frequency of the component.

9. The system of claim 1, wherein the measured electrical signals are transmitted to the remote processor via one or more of: ethernet and fibre-optic cable.

10. The system of claim 1, wherein the system is configured to continuously monitor the rotating electrical machinery in real time.

11. The system of claim 1, wherein the system is configured to compare the frequency components of the current electrical signals to the frequency components of the voltage electrical signals.

12. The system of claim 1, wherein the system is configured to monitor the frequency components of the electrical signals determine changes in the frequency components over time.

13. The system of claim 1, wherein the system is configured to monitor how the frequency components of the electrical signals varies with velocity of the rotating electrical machinery.

14. The system of claim 1, wherein the system is configured to measure 3-phase electrical signals.

15. The system of claim 1, wherein the rotating electrical machinery comprises an electrical motor or an electrical generator.

16. A method for monitoring operation of an electrical drive of rotating electrical machinery, comprising:
   measuring analog electrical signals generated by the rotating electrical machinery, the measured electrical signals corresponding to a voltage and a current of the rotating electrical machinery;

receiving the measured electrical signals at a remote processor; and identifying frequency components independently in the measured electrical signals, and receiving and/or calculating speed signals corresponding to a set speed and to an actual speed of the electrical drive, wherein the set speed is a target speed setpoint set by a controller of the rotating electrical machinery.

17. A method for monitoring and controlling operation of an electrical drive of a motor in a rotary electric machine comprising:

receiving current and voltage signals from the rotary electric machine;

determining a speed of the rotary electric machinery;

identifying frequency components of the current signal;

identifying frequency components of the voltage signal;

monitoring the system in normal use to determine normal frequency components of the torque signal;

identifying a fault frequency component based on deviations of the identified frequency components of the current signals and of the voltage signals from the normal frequency components of the current and voltage signals; and receiving and/or calculating speed signals corresponding to a set speed and to an actual speed of the electrical drive, wherein the set speed is a target speed setpoint set by a controller of the rotating electrical machine.

18. The method of claim 17, wherein the method comprises:

identifying a fault frequency; and sending a control signal to the electrical drive to impedance match the identified fault frequency.

19. The method of claim 17, wherein the method comprises one or more of:

estimating a time to failure; estimating a cause of failure; and calculating PI controller gains.

* * * * *